US008274162B2

(12) United States Patent
Monthei et al.

(10) Patent No.: US 8,274,162 B2

(45) Date of Patent: Sep. 25, 2012

(54) APPARATUS AND METHOD FOR REDUCED DELAMINATION OF AN INTEGRATED CIRCUIT MODULE

(75) Inventors: Dean L. Monthei, Beaverton, OR (US); Antonio Espinoza, Lake Oswego, OR (US); Waldemar J. Holgado, Hillsboro, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 669 days.

(21) Appl. No.: 11/656,138

(22) Filed: Jan. 20, 2007

(65) Prior Publication Data

US 2008/0174003 A1 Jul. 24, 2008

(51) Int. Cl.
*H01L 23/48* (2006.01)

(52) U.S. Cl. .................................. 257/781; 257/E23.01

(58) Field of Classification Search .................. 257/782, 257/783, 786, 787, 731, 732, 691–697, 780, 257/781, 784, 666, 690, E21.476, E23.01
See application file for complete search history.

(56) References Cited

U.S. PATENT DOCUMENTS 5,075,254 A 12/1991 Robinson et al.
5,146,310 A 9/1992 Bayan et al.
5,150,197 A 9/1992 Hamburgen
5,304,842 A 4/1994 Farnworth et al.
5,397,915 A 3/1995 Nose
5,756,380 A * 5/1998 Berg et al. ..................... 438/126
6,169,322 B1 1/2001 Chang et al.
6,184,064 B1 2/2001 Jiang et al.
6,825,560 B1 * 11/2004 Walker et al. ................. 257/746
6,872,661 B1 3/2005 Kwan et al.
6,885,561 B1 4/2005 Hashemi et al.
6,917,112 B2 7/2005 Basceri et al.
6,946,744 B2 * 9/2005 Maxwell et al. .............. 257/782
7,042,103 B2 5/2006 Condie et al.
7,164,192 B2 1/2007 Petty-Weeks et al.
2004/0046248 A1 * 3/2004 Waelti et al. .................. 257/712
2006/0110855 A1 5/2006 Kwan et al.

* cited by examiner

*Primary Examiner* — Hoa B Trinh

(74) *Attorney, Agent, or Firm* — Schwabe Williamson & Wyatt

(57) ABSTRACT

An apparatus and method for reducing delamination of an integrated circuit module is disclosed. The integrated circuit module includes a laminate substrate. The integrated circuit module further includes an integrated circuit die operably coupled with the laminate substrate and a plastic semiconductor package overmolded with the laminate substrate. The laminate substrate includes a die attach pad including a plurality of metal oxide regions and non-oxidized metal regions disposed on the die attach pads.

19 Claims, 3 Drawing Sheets

100
110
122
124a
120a
122
124b
120b
122
124c
120c

APPARATUS AND METHOD FOR REDUCED DELAMINATION OF AN INTEGRATED CIRCUIT MODULE

TECHNICAL FIELD OF THE INVENTION

Embodiments of the present invention relate generally to semiconductor devices and more specifically, to an apparatus and method for reducing delamination in an integrated circuit module.

BACKGROUND OF THE INVENTION

Integrated circuits and other semiconductor devices, such as, for example, a radio frequency (RF) power amplifier, a low-noise amplifier, or other like circuitry, may be created on a semiconductor substrate. An integrated circuit created on a semiconductor substrate is commonly referred to as an integrated circuit die. A semiconductor substrate that contains integrated circuit die is commonly referred to as a semiconductor wafer, or simply a wafer. Integrated circuit die is removed from a wafer by, for example, dicing the wafer in order to separate the integrated circuit die into individual pieces.

Integrated circuit die may be packaged in, for example, a plastic semiconductor package. The packaging process includes attaching the integrated circuit die to a die attach pad on a laminate substrate with, for example, an epoxy material. The laminate substrate is then overmolded with a plastic mold compound material, which forms the plastic semiconductor package. Typically, the die attach, molding, and curing of the plastic semiconductor package is performed under a high temperature environment. The differences in the coefficients of thermal expansion of the integrated circuit die, die attach epoxy, plastic mold compound material, and the laminate substrate result in thermal stress created during the heating and cooling phases of the packaging process.

Once the packaging process is complete, the plastic semiconductor package is shipped and delivered for final assembly, such as, for example, mounting the plastic semiconductor package on a circuit board of a wireless device. However, during the shipping and delivery of the plastic semiconductor package, and prior to final assembly, the plastic semiconductor package is subjected to various environmental conditions that expose the plastic semiconductor package to moisture. This exposure to moisture adds moisture content to the plastic semiconductor package. This in turn adds additional thermal stress to the plastic semiconductor package, over and above that caused by thermal-expansion coefficient differences, during high temperature processes. For example, any moisture content that is present in the plastic semiconductor package causes a greater thermal expansion at the die attach epoxy interface between the laminate substrate and the integrated circuit die.

This thermal expansion at the die attach epoxy interface produces an additional stress at the die attach epoxy interface. Since the laminate substrate is overmolded with a plastic mold compound material, this additional stress causes the die attach epoxy interface to crack or delaminate, during, for example, high temperature processes. This cracking or delamination of the die attach epoxy interface is undesirable.

Conventional laminate substrates typically utilize a gold plating process to form a finish on the outer layer of the die attach pad. However, while the gold finish provides for good electrical conductivity, it does not provide for good adhesion of the die attach epoxy interface. Consequently, the die attach epoxy interface is susceptible to cracking or delamination for this reason as well.

In an effort to overcome cracking or delamination at the die attach epoxy interface, prior art laminate substrates have tried to utilize better adhesion processes on the die attach pads, such as, for example, solder mask. However, the use of solder mask on the die attach pad is disadvantageous since, for example, solder mask is an extremely poor electrical and thermal conductor. The interface between the integrated circuit die and the die attach pad ideally should not adversely affect adhesion, electrical conductivity, or thermal performance. In addition, solder mask on top of the die attach pad increases the height of the integrated circuit die attached to the die attach pad and increases the electrical and thermal resistance of the die attach epoxy interface. This increases the probability of cracking and delaminating of the die attach epoxy interface and decreases the overall reliability of the plastic semiconductor package.

BRIEF DESCRIPTION OF THE DRAWINGS

The novel features believed to be characteristic of embodiments of the invention are set forth in the appended claims. However, embodiments of the invention will best be understood by reference to the following detailed description when read in conjunction with the accompanying drawings, wherein embodiments of the invention are illustrated by way of example, and not by way of limitation, in the figures of the accompanying drawings in which like reference numerals refer to similar elements.

DETAILED DESCRIPTION OF THE INVENTION

Reference will now be made to the following detailed description of the exemplary embodiments of the present invention. Those skilled in the art will recognize that embodiments of the present invention provide many inventive concepts and novel features that are merely illustrative and not to be construed as restrictive. Accordingly, the specific embodiments discussed herein are given by way of example and do not limit the scope of the embodiments of the present invention. In addition, those skilled in the art will understand that for purposes of explanation, numerous specific details are set forth, though embodiments of the invention can be practiced without these specific details, and that certain features have been omitted so as to more clearly illustrate embodiments of the invention.

Figure 1:
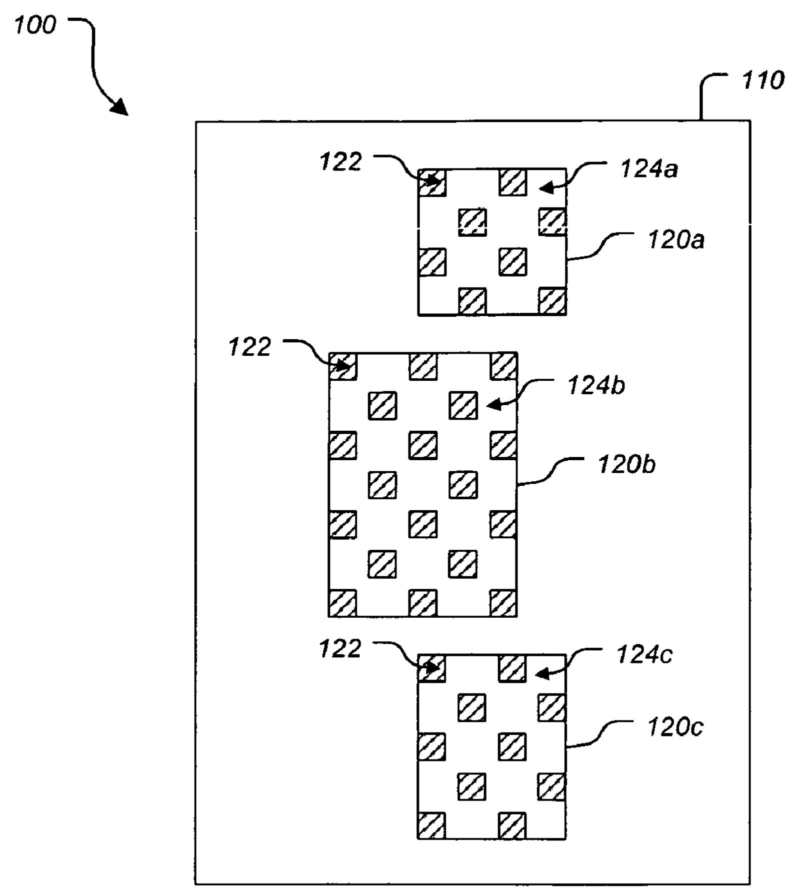
FIG. 1 illustrates a layout diagram of an integrated circuit according to one embodiment of the present invention.

FIG. 1 illustrates a layout diagram of an integrated circuit 100 according to one embodiment of the present invention. Integrated circuit 100 comprises a laminate substrate 110, and die attach pads 120*a*-120*c*. For simplicity and clarity, only so much of the construction and operation of integrated circuit 100 as is necessary for an understanding of the present invention is shown and described. The remainder of the construction and operation of integrated circuit 100 may follow conventional practices. For example, laminate structure 110 may comprise conductive traces, vias, solder mask, and other conductive pads for attaching various passive and active components according to conventional practices.

In addition, although integrated circuit 100 is shown and described as having three die attach pads 120*a*-120*c*, embodiments of the present invention contemplate any number of die attach pads in any suitable arrangement, shape or combination of shapes. Moreover, it is understood that integrated circuit 100 should not be construed to limit the types of applications in which embodiments of the present invention may be implemented.

In one embodiment of the present invention, laminate substrate 110 is a printed circuit board (PCB). Although laminate substrate 110 is described as a PCB, embodiments of the present invention contemplate any suitable electronic substrate, such as, for example, a structure with an organic core and one or more dielectric layers on or covering the core, or any other suitable electronic substrate.

Die attach pads 120*a*-120*c* comprise patterns of high adhesion metal oxide 122 and non-oxidized high conductivity metal 124*a*-124*c* dispersed across the surface area of die attach pads 120*a*-120*c*, described in more detail in FIGS. 3A-3F. As shown in FIGS. 3A-3F, some of the patterns are alternating patterns of high-adhesion metal oxide 122 and non-oxidized high-conductivity metal 124*a*-124*c*. In essence, the pattern divides die attach pads 120*a*-120*c* into high adhesion metal oxide regions and non-oxidized high conductivity metal regions which provide increased adhesion, electrical conductivity, and thermal performance, of integrated circuit 100 and in particular die attach pads 120*a*-120*c*. As discussed in more detail below, this pattern increases the mechanical strength of the die attach epoxy interface, between the die attach epoxy and die attach pads 120*a*-120*c*, and reduces any potential of cracking or delamination of the die attach epoxy interface associated with any moisture content introduced into integrated circuit 100.

In another embodiment of the present invention, non-oxidized high conductivity metal 124*a*-124*c* is gold. Although non-oxidized high conductivity metal 124*a*-124*c* is described as gold, embodiments of the present invention contemplate any suitable non-oxidized high conductivity metal such as, for example, palladium, silver, copper, or any other suitable non-oxidized high conductivity metal.

In another embodiment of the present invention, high adhesion metal oxide 122 is an oxidized finish that enhances adhesion of the die attach epoxy interface, as discussed below in more detail. The oxidized finish is processed during the manufacturing of laminate substrate 110. Although high adhesion metal oxide 122 is described as an oxidized finish, embodiments of the present invention contemplate any suitable high adhesion metal oxide such as, for example, brown oxide, black oxide, copper oxide, titanium oxide, or any other suitable adhesion-promoting material. In addition or as an alternative, high adhesion metal oxide 122 may be a pure metal or an alloyed metal, such as for example, titanium, chromium, iron, nickel, tungsten, or any other suitable adhesion-promoting metal.

Embodiments of the present invention provide a pattern of high adhesion metal oxide 122 and non-oxidized high conductivity metal 124*a*-124*c* dispersed across the surface area of die attach pads 120*a*-120*c*. The non-oxidized high conductivity metal regions provide a low resistance path for the high frequency currents of the integrated circuit die. While the high adhesion metal oxide regions provide an adhesive region that increases the mechanical strength of the die attach epoxy interface between the die attach epoxy and die attach pads 120*a*-120*c*, the high adhesion metal oxide regions also provide for a higher resistive path for the high frequency current to flow, relative to the non-oxidized high conductivity metal regions.

Accordingly, the patterns of resistive regions on die attach pads 120*a*-120*c* provide for a predominate path of current flow from the integrated circuit die at high frequencies, while providing an improved level of adhesion for reducing any potential of cracking or delamination of the die attach epoxy interface. For example, the high-adhesion metal-oxide regions may be an alternating pattern dispersed across the surface area of the non-oxidized high-conductivity metal regions and comprising a percentage of the surface area of die attach pads 120*a*-120*c*. Embodiments of the present invention contemplate any suitable percentage such as, for example, 10%, 25%, 50%, 75%, 90%, or any other suitable percentage of surface area.

Therefore, in accordance with the principles of embodiments of the present invention, the patterns of high adhesion metal oxide 122 and non-oxidized high conductivity metal 124*a*-124*c* dispersed across the surface area of die attach pads 120*a*-120*c* provides for an increase in the mechanical strength of the die attach epoxy interface and reduces any potential of cracking or delamination of the die attach epoxy interface. In addition, embodiments of the present invention provide for dividing the die attach pads into high adhesion metal oxide regions and non-oxidized high conductivity metal regions, rather than only a high adhesion metal oxide die attach pad or a non-oxidized high conductivity metal die attach pad like some prior art laminate substrates. Among other things, this increases the mechanical strength of the die attach epoxy interface without compromising the electrical conductivity or the thermal performance associated with the mounting of the integrated circuit die to die attach pads 120*a*-120*c*. In addition, this increases the overall reliability of integrated circuit 100.

Although die attach pads 120*a*-120*c* of FIG. 1 are shown and described as a checkerboard pattern of high adhesion metal oxide regions and non-oxidized high conductivity metal regions. Embodiments of the present invention provide for any suitable pattern or combination of patterns that increases the adhesion, electrical conductivity, and thermal performance of the interface between die attach pads 120*a*-120*c* and the integrated circuit die, as described in more detail below with respect to FIGS. 3A-3F.

Figure 2:
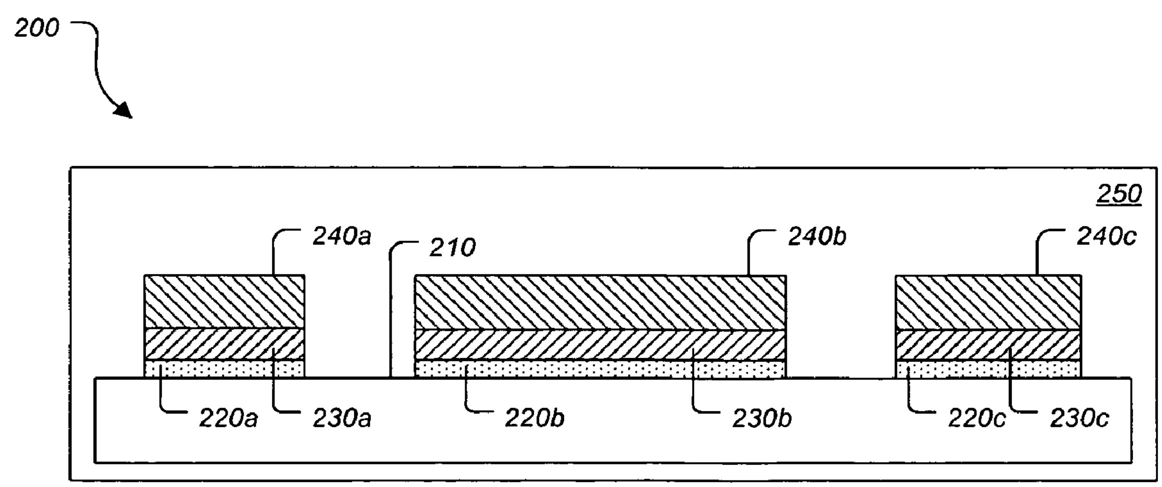
FIG. 2 illustrates a cross section of an integrated circuit module according to another embodiment of the present invention.

FIG. 2 illustrates a cross sectional view of an integrated circuit module 200 according to another embodiment of the present invention. Integrated circuit module 200 comprises a laminate substrate 210, die attach pads 220*a*-220*c*, epoxy 230*a*-230*c*, integrated circuit die 240*a*-240*c*, and a plastic semiconductor package 250. For simplicity and clarity, only so much of the construction and operation of plastic semiconductor package 250 as is necessary for an understanding of the present invention is shown and described. The remainder of the construction and operation of plastic semiconductor package 250 may follow conventional practices.

In one embodiment of the present invention, integrated circuit die 240*a*-240*c* may be fabricated using various semiconductor materials such as, for example, Gallium Arsenide (GaAs), Indium Phosphide (InP), Gallium Nitride (GaN), Silicon (Si), and derivatives of the foregoing, such as Aluminum Gallium Arsenide (AlGaAs), Indium Gallium Arsenide (InGaAs), Indium Gallium Phosphide (InGaP), Indium Aluminum Arsenide (InAlAs), Aluminum Gallium Nitride (AlGaN), Indium Gallium Nitride (InGaN), Gallium Arsenide Antimonide (GaAsSb), Indium Gallium Arsenide Nitride (InGaAsN), and Aluminum Arsenide (AlAs), for example. In one embodiment of the present invention, integrated circuit die 240a-240c is formed on a Gallium Arsenide (GaAs) substrate. However, integrated circuit die 240a-240c may be formed on other types of substrates, such as, for example, Indium Phosphide (InP) and Gallium Nitride (GaN).

As discussed above with reference to FIG. 1, the pattern of high- adhesion metal oxide regions and non-oxidized high conductivity metal regions dispersed on die attach pads 220a-220c provide for increased adhesion, electrical conductivity and thermal performance, so that the introduction of any moisture content into integrated circuit module 200 reduces any potential of cracking or delamination of the die attach epoxy interface.

In one embodiment of the present invention, integrated circuit die 240a-240c may be mounted to die attach pads 220a-220c epoxy 230a-230c. Epoxy 230a-230c may be a silver-filled conductive epoxy such as, for example, but not limited to Ablestik 84-1 LMI. Although epoxy 230a-230c is described as Ablestik 84-1 LMI, embodiments of the present invention contemplate any suitable die adhesive material or any other suitable conductive epoxy material.

Once integrated circuit die 240a-240c is mounted to die attach pads 220a-220c, laminate substrate 210 may be populated with other passive and active components according to conventional practices. Laminate substrate 210 may then be overmolded to create plastic semiconductor package 250. In addition, although a plastic semiconductor package 250 is shown and described as overmolded on laminate 210 in a particular manner, embodiments of the present invention contemplate any type of overmolding process or any type of plastic semiconductor package. Moreover, it is understood that plastic semiconductor package 250 should not be construed to limit the types of applications in which embodiments of the present invention may be implemented.

In another embodiment of the present invention, integrated circuit module 200 may be mounted or otherwise coupled on a circuit board. For example, integrated circuit module 200 may be mounted or coupled on a circuit board using known soldering techniques in one or more high temperature environments. In addition, or as an alternative, integrated circuit module 200 may be mounted or coupled to a circuit board using known epoxy techniques in one or more high temperature environments. It is understood that other mounting techniques may be implemented within the scope of the embodiments of the present invention. It is also understood that the sequence of the mounting techniques may be varied without departing from the scope or principles of embodiments of the present invention.

Embodiments of the present invention operate in conjunction with the adhesion properties of the oxidized finish in the high adhesion metal oxide regions and the electrical and thermal properties of the non-oxidized high conductivity metal regions. For example, the alternating pattern of high-adhesion metal-oxide regions and non-oxidized high conductivity metal regions dispersed on die attach pads 120a-120c increases the adhesion of the die attach epoxy interface and reduces any potential of cracking or delamination of the die attach epoxy interface associated with any moisture content introduced into integrated circuit module 200. Therefore, in accordance with the principles of embodiments of the present invention, integrated circuit module 200 provides increased adhesion, electrical conductivity, and thermal performance, so the introduction of any moisture content prior to a high temperature process, reduces any potential of cracking or delamination of the die attach epoxy interface between the integrated circuit die and the die attach pad.

FIGS. 3A-3F illustrate die attach pads 120a-120c of FIG. 1 according to embodiments of the present invention. As discussed above, die attach pads 120a-120c comprise patterns of high-adhesion metal oxide regions and non-oxidized high conductivity metal regions. In addition, the high adhesion metal oxide regions in FIGS. 3A-3F may be any high adhesion regions, as an example only and not by way of limitation, brown oxide, black oxide, copper oxide, titanium oxide, or any other suitable adhesion-promoting material. In addition or as an alternative, in FIGS. 3A-3F, the non-oxidized high conductivity regions may be any high conductivity regions, such as, for example, but not limited to gold, palladium, silver, copper, or any other suitable non-oxidized high conductivity metal.

Figure 3A:
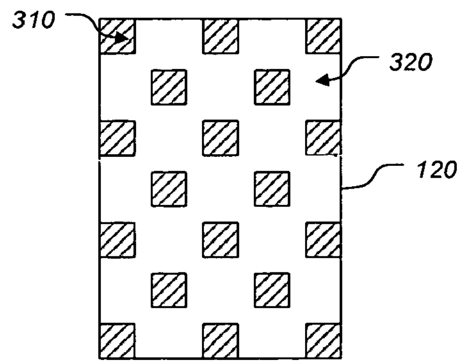
FIGS. 3A-3F illustrate the die attach pads of FIG. 1 according to embodiments of the present invention.

In FIG. 3A, die attach pad 120 comprises a plurality of square high adhesion metal oxide regions 310 and a plurality of non-oxidized high conductivity metal regions 320. In one embodiment of the present invention, the alternating pattern of square high adhesion metal oxide regions 310 and non-oxidized high conductivity metal regions 320 are configured in such a manner as to allow the high frequency currents of the integrated circuit die to flow predominately through non-oxidized high conductivity metal regions 320 (i.e., the low-resistance path). In addition, the configuration of the square high adhesion metal oxide regions 310 provides for increased adhesion and mechanical strength of the die attach epoxy interface.

Figure 3B:
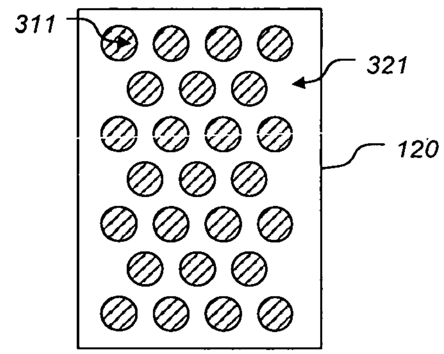

In FIG. 3B, die attach pad 120 comprises a plurality of circular high adhesion metal oxide regions 311 and a plurality of non-oxidized high conductivity metal regions 321. The configuration of the high adhesion metal oxide regions in FIG. 3B is similar to the configuration of the high adhesion metal oxide regions in FIG. 3A, except for the circular configuration of the high adhesion metal oxide regions.

Figure 3C:
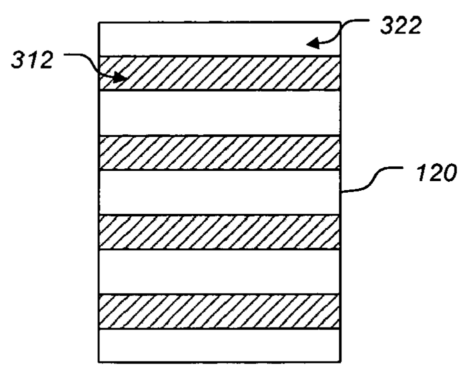

In FIG. 3C, die attach pad 120 comprises several horizontal rectangular high adhesion metal oxide regions 312 dispersed among non-oxidized high conductivity metal regions 322. In another embodiment of the present invention, the alternating pattern of the several horizontal rectangular high adhesion metal oxide regions 312 dispersed among non-oxidized high conductivity metal regions 322 are configured in such a manner as to allow the high frequency currents of the integrated circuit die to flow predominately through non-oxidized high conductivity metal regions 322 (i.e., the low resistance path). In addition, the configuration of the several horizontal rectangular high adhesion metal oxide regions 312 provide for increased adhesion and mechanical strength of the die attach epoxy interface.

Figure 3D:
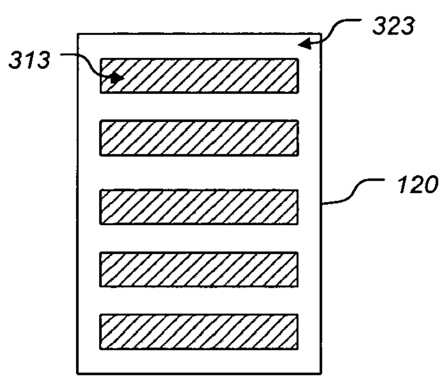

In FIG. 3D, die attach pad 120 comprises several horizontal rectangular high adhesion metal oxide regions 313, wherein each of the several horizontal rectangular high adhesion metal oxide regions is surrounded by a non-oxidized high conductivity metal region 323. The configuration of the several horizontal rectangular high adhesion metal oxide regions in FIG. 3D is similar to the configuration of the several horizontal rectangular high adhesion metal oxide regions in FIG. 3C, except for the size of the horizontal rectangular high adhesion metal oxide regions.

Figure 3E:
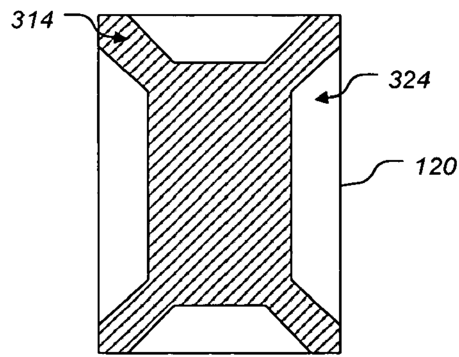

In FIG. 3E, die attach pad 120 comprises a large high adhesion metal oxide region 314 in the middle of die attach pad 120, wherein the large high adhesion metal oxide region 314 further extends to each of the corners of die attach pad 120 and are joined on each of the sides of die attach pad 120 by non-oxidized high conductivity metal regions 324. In another embodiment of the present invention, the large high adhesion metal oxide region 314 is configured in such a manner as to provide increased adhesion and mechanical strength in the middle portion of die attach pad 120. In addition, the configuration allows for the high frequency currents of the integrated circuit die to flow predominately through non-oxidized high conductivity metal regions 324 (i.e., the low resistance path) in the side portions of die attach pad 120.

Figure 3F:
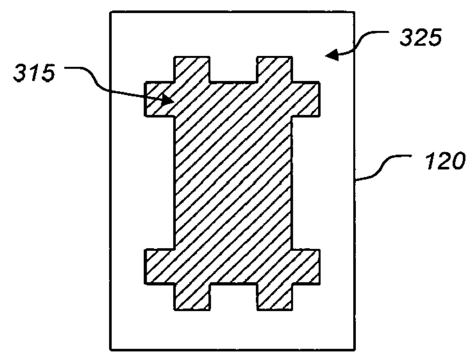

In FIG. 3F, die attach pad 120 comprises a large high adhesion metal oxide region 315 in the middle of die attach pad 120, wherein the large high adhesion metal oxide region 315 is surrounded by a non-oxidized high conductivity metal region 325. The configuration of the large high adhesion metal oxide region 315 is similar to the configuration of the large high adhesion metal oxide region 314 in FIG. 3E, except for the size of the large high adhesion metal oxide region.

Although die attach pads 120 are shown and described as having a particular arrangement of high adhesion metal oxide regions and non-oxidized high conductivity metal regions, embodiments of the present invention contemplate any arrangement of high adhesion metal oxide regions and non-oxidized high conductivity metal regions herein and/or any combination of high adhesion metal oxide regions and non-oxidized high conductivity metal regions herein to reduce cracking or delamination of the die attach epoxy interface between the integrated circuit die and die attach pads 120.

Figure 4:
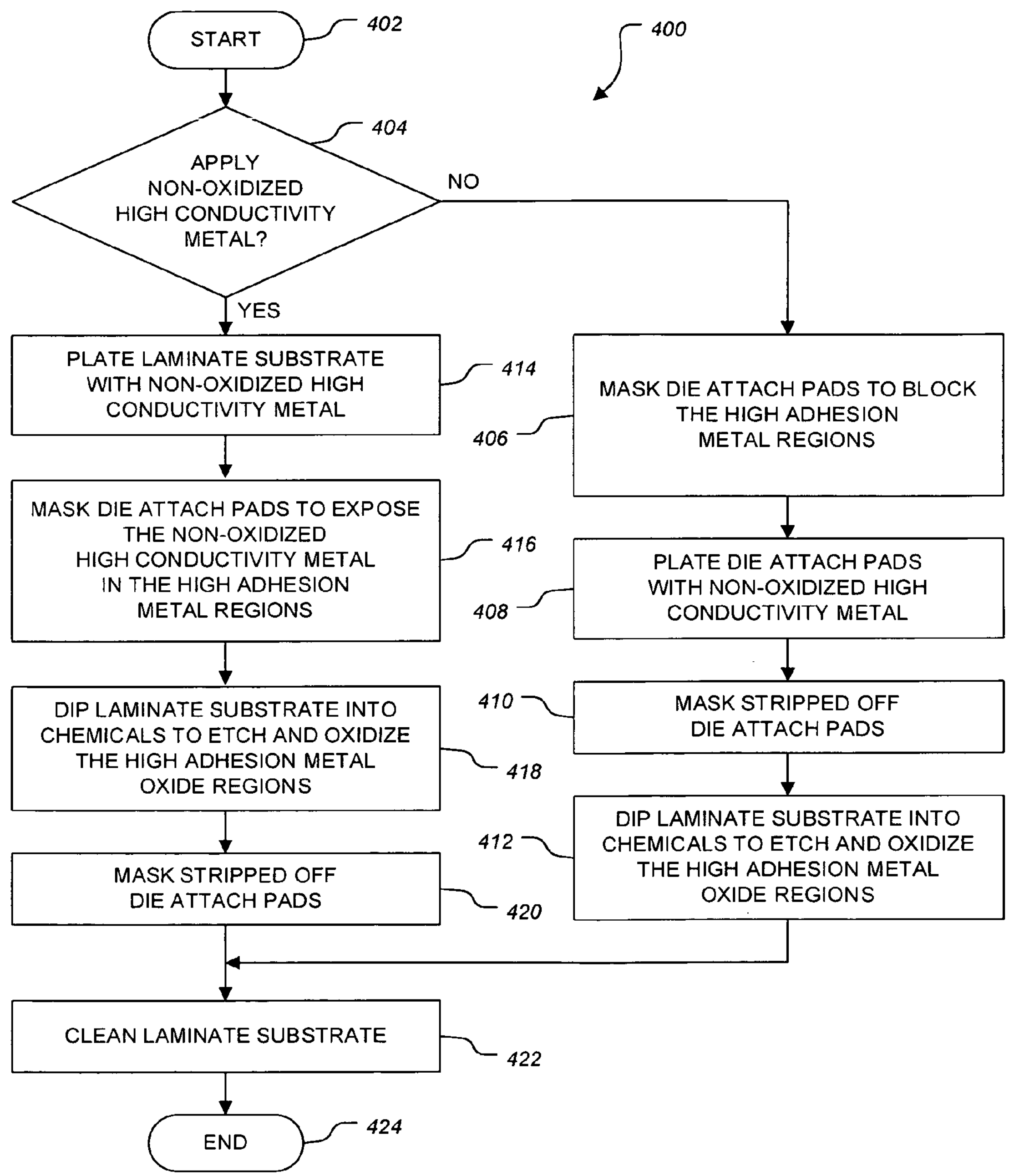
FIG. 4 illustrates a flow chart of a process for reduced delamination of an integrated circuit according to embodiments of the present invention.

FIG. 4 illustrates a flow chart 400 of a process for reduced delamination of an integrated circuit according to embodiments of the present invention. As discussed above, laminate substrate 110 may be any suitable electronic substrate such as, for example, a PCB, a structure with an organic core and one or more dielectric layers on or covering the core, or any other suitable electronic substrate.

Flow chart 400 starts at 402. At 404, a determination is made as to whether to apply non-oxidized high conductivity metal to die attach pads 120 prior to applying the high adhesion metal oxide regions. If the non-oxidized high conductivity metal is to be applied prior to the high adhesion metal oxide regions, the process continues to 414. On the other hand, if the high adhesion metal oxide regions are to be applied prior to the non-oxidized high conductivity metal on die attach pads 120, the process continues at 406.

At 406, die attach pads 120 are masked to block the high adhesion metal oxide regions. Other parts of laminate substrate 110 may be masked without departing from the spirit and scope of embodiments of the present invention. As discussed above, the non-oxidized high conductivity metal regions may be any suitable non-oxidized high conductivity metal such as, for example, gold, palladium, silver, copper, or any other suitable non-oxidized high conductivity metal.

At 408, die attach pads 120 are plated with the non-oxidized high conductivity metal. Other parts of laminate substrate 110 may be plated with the non-oxidized high conductivity metal without departing from the spirit and scope of embodiments of the present invention. The process continues at 410, where the mask applied at 406 is stripped off die attach pads 120. At 412, laminate substrate 110 is dipped into chemicals to etch (i.e., roughen) and oxidize the high adhesion metal oxide regions that were masked off at 406, since the chemicals do not affect non-oxidized high conductivity metal regions. As discussed above, the high adhesion metal oxide regions may be any oxidized finish that enhances adhesion of the die attach epoxy interface. The oxidized finish may be any suitable high adhesion metal oxide such as, for example, but not limited to brown oxide, black oxide, copper oxide, titanium oxide, or any other suitable adhesion-promoting material.

However, if as discussed above from inquiry 404, the non-oxidized high conductivity metal is to be applied to die attach pads 120 prior to the high adhesion metal oxide regions, the process from inquiry 404, continues at 414. At 414, laminate substrate 110 including die attach pads 120 are plated with the non-oxidized high conductivity metal. At 416, die attach pads 120 are masked to expose non-oxidized high conductivity metal in high adhesion metal oxide regions. Other parts of laminate substrate 110 may be masked without departing from the spirit and scope of embodiments of the present invention. At 418, laminate substrate 110 is dipped into chemicals to remove the high conductivity metal and etch (i.e., roughen) and oxidize the high adhesion metal oxide regions that are not masked. The process continues at 420, where the mask applied at 416 is stripped off die attach pads 120.

Laminate substrate 110 is cleaned at 422, and the process ends at 424. As described above, embodiments of the present invention operate in conjunction with the alternating patterns of high adhesion metal oxide regions and non-oxidized high conductivity metal regions dispersed across the surface area of die attach pads 120. Therefore, in accordance with the principles of embodiments of the present invention, the alternating pattern of the high adhesion metal oxide regions and the non-oxidized high conductivity metal regions provides for reduced cracking and delamination of die attach epoxy interface and provides for increased adhesion, electrical conductivity, and thermal performance between die attach pad 120 and the integrated circuit die.

Reference in the foregoing specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the exemplary embodiments of the present invention have been shown and described, it will be understood that various changes and modifications to the foregoing embodiments may become apparent to those skilled in the art without departing from the spirit and scope of the present invention. Accordingly, the invention is not limited to the embodiments disclosed, but rather by the appended claims and their equivalents.

What is claimed is:

1. An integrated circuit, comprising:

a laminate substrate; and one or more die attach pads disposed on the laminate substrate, the one or more die attach pads including one or more metal oxide regions and one or more non-oxidized metal regions, the one or more metal oxide regions and the one or more non-oxidized metal regions being directly disposed on a common surface area of each of the one or more die attach pads, wherein the one or more metal oxide regions and the one or more non-oxidized metal regions are disposed in a pattern such that current is configured to flow predominately through the one or more non-oxidized metal regions of the pattern, wherein the one or more metal oxide regions and the one or more non-oxidized metal regions of the one or more die attach pads are configured to receive a die attach epoxy material to facilitate coupling of an integrated circuit die with the laminate substrate.

2. The integrated circuit of claim 1, wherein the pattern of the one or more metal oxide regions comprises a plurality of square metal oxide regions.

3. The integrated circuit of claim 1, wherein the pattern of the one or more metal oxide regions comprises a plurality of circular metal oxide regions.

4. The integrated circuit of claim 1, wherein the pattern of the one or more metal oxide regions comprises a plurality of rectangular metal oxide regions.

5. The integrated circuit of claim 4, wherein the plurality of rectangular metal oxide regions are disposed between a first edge of the one or more die attach pads and a second edge of the one or more die attach pads.

6. The integrated circuit of claim 1, wherein the pattern of the one or more metal oxide regions comprises a metal oxide region disposed in the center of the one or more die attach pads.

7. The integrated circuit of claim 6, wherein the metal oxide region extends to each of the corners of the one or more die attach pads.

8. The circuit of claim 1, wherein the metal of the one or more non-oxidized metal regions is selected from the group consisting of:

gold;
palladium;
silver; and
copper.

9. The integrated circuit of claim 1, wherein the one or more metal oxide regions are etched with an oxidized finish.

10. The integrated circuit of claim 9, wherein the oxidized finish is selected from the group consisting of:

brown oxide;
black oxide;
copper oxide; and
titanium oxide.

11. The integrated circuit of claim 1, wherein the one or more metal oxide regions comprise a metal selected from the group consisting of:

titanium;
chromium;
iron;
nickel; and
tungsten.

12. The integrated circuit of claim 1, wherein the one or more non-oxidized metal regions provide a low resistance path for high frequency currents.

13. The integrated circuit of claim 1, wherein the one or more metal oxide regions provide a high resistance path for high frequency currents.

14. An integrated circuit module, comprising:

a laminate substrate, wherein the laminate substrate comprises one or more die attach pads disposed on the laminate substrate, the one or more die attach pads including one or more metal oxide regions and one or more non-oxidized metal regions, the one or more metal oxide regions and the one or more non-oxidized metal regions being directly disposed on a common surface area of each of the one or more die attach pads;

a die attach epoxy material disposed on the one or more metal oxide regions and the one or more non-oxidized metal regions of the one or more die attach pads; and an integrated circuit die coupled with the one or more die attach pads of the laminate substrate using the die attach epoxy material, wherein the one or more metal oxide regions and the one or more non-oxidized metal regions are disposed in a pattern such that current of the integrated circuit die is configured to flow predominately through the one or more non-oxidized metal regions of the pattern.

15. The integrated circuit module of claim 14, wherein the die attach epoxy material is a silver-filled conductive epoxy.

16. The integrated circuit module of claim 14, wherein the one or more metal oxide regions provide an adhesive region for increasing the mechanical strength of a die attach interface between the one or more die attach pads and the die attach epoxy material.

17. The integrated circuit module of claim 14, wherein the integrated circuit module is operably coupled with a wireless device circuit board.

18. The integrated circuit module of claim 14, wherein the integrated circuit die includes material selected from the group consisting of:

Gallium Arsenide;
Silicon;
Indium Phosphide;
Gallium Nitride;
Aluminum Gallium Arsenide;
Indium Gallium Arsenide;
Indium Gallium Phosphide;
Indium Aluminum Arsenide;
Aluminum Gallium Nitride;
Indium Gallium Nitride;
Gallium Arsenide Antimonide;
Indium Gallium Arsenide Nitride; and
Aluminum Arsenide.

19. The integrated circuit module of claim 14, further comprising:

a plastic semiconductor package overmolded with the laminate substrate.

* * * * *